(12) United States Patent
Fjelstad

(10) Patent No.: US 6,253,992 B1
(45) Date of Patent: Jul. 3, 2001

(54) SOLDER BALL PLACEMENT FIXTURES AND METHODS

(75) Inventor: Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/270,988

(22) Filed: Mar. 17, 1999

Related U.S. Application Data (60) Provisional application No. 60/078,472, filed on Mar. 18, 1998.

(51) Int. Cl.⁷ .............................. B23K 35/12; B23K 1/00; B23K 35/14
(52) U.S. Cl. ........................ 228/245; 228/41; 228/56.3; 228/246
(58) Field of Search ................ 228/246, 41, 180.22, 228/245, 56.3

(56) References Cited

U.S. PATENT DOCUMENTS

| | | | |
|---|---|---|---|
| 5,118,027 | * | 6/1992 | Braun et al. ............... 228/180.22 |
| 5,431,332 | * | 7/1995 | Kirby et al. ............... 228/246 |
| 5,539,153 | * | 7/1996 | Schwiebert et al. ............... 174/260 |
| 5,586,715 | * | 12/1996 | Schwiebert et al. ............... 228/248.1 |
| 5,620,927 | * | 4/1997 | Lee ............... 29/841 |
| 5,662,821 | * | 9/1997 | Ruckl ............... 219/121.67 |
| 5,855,323 | * | 1/1999 | Yost et al. . |
| 5,872,051 | * | 2/1999 | Fallon et al. ............... 438/616 |
| 5,918,792 | * | 7/1999 | Stumpe et al. ............... 228/41 |
| 5,984,164 | * | 11/1999 | Wark ............... 228/164 |
| 6,119,927 | * | 9/2000 | Ramos et al. ............... 228/254 |

* cited by examiner

Primary Examiner—Tom Dunn
Assistant Examiner—Zidia Pittman
(74) Attorney, Agent, or Firm—Lerner, David, Littenberg, Krumholz & Mentlik, LLP (57) ABSTRACT

Bonding material balls such as solder balls are applied onto contacts of a semiconductor chip or other microelectronic unit using an escapement mechanism which feeds one solder ball per cycle into each aperture of a stencil. The apparatus reliably places one solder ball on each contact of the microelectronic unit.

14 Claims, 4 Drawing Sheets

SOLDER BALL PLACEMENT FIXTURES AND METHODS

CROSS REFERENCE TO RELATED APPLICATIONS

This application claims benefit of Provisional Application Serial No. 60/078,472, filed Mar. 18, 1998, now expired the disclosure of which is hereby incorporated by reference herein.

FIELD OF THE INVENTION

The present invention generally relates to methods of making microelectronic assemblies, and more particularly relates to methods of affixing bonding material balls, such as solder balls, on conductive features such as contacts accessible at one or more surfaces of a microelectronic assembly.

BACKGROUND OF THE INVENTION

A microelectronic unit, such as a semiconductor chip, is typically connected to an external circuit element through contacts accessible at a surface of the microelectronic unit. For example, in a so-called "flip chip" process, solder balls are provided directly on the contacts of a bare semiconductor chip, so that the solder balls project from the front or contact-bearing surface of the chip. The bare chip is placed front-side down on a circuit board, so that the solder balls rest on contact pads of circuit board, also referred to as a printed wiring board or "PWB". The solder is "reflowed" by bringing the assembly to a temperature above the melting temperature of the solder and then allowing the assembly to cool. The solder forms connections between the contacts on the chip and the contact pads on the PWB. In a variant of this process, the solder balls are provided on the PWB, rather than on the chip.

As described, for example, in certain embodiments of commonly assigned U.S. Pat. Nos. 5,148,265; 5,148,266; and 5,518,964, the disclosures of which are hereby incorporated by reference herein, packaged semiconductor chips can be provided with a packaging element having terminals thereon, the terminals being connected to the contacts of the chip. In certain embodiments described in these patents the terminals are solder-bonded to other elements, such as to contact pads on a circuit board, by processes generally similar to those used in flip-chip bonding of a bare chip. Thus, solder balls can be placed on the terminals of the packaged semiconductor chip and the resulting assembly can be placed onto a PWB. As described in preferred embodiments of these patents, the terminals of the package may be movable with respect to the chip. This minimizes stress on the solder balls during service. As further described in preferred embodiments of U.S. Pat. No. 5,801,446, the disclosure of which is hereby incorporated by reference herein, generally similar structures can be made using solid core solder balls, i.e., solder balls having a center or core formed from copper or another material which does not melt during the solder reflow operation.

In still other processes, commonly referred to as tape automated bonding or "TAB", a flexible dielectric sheet, such as a thin foil of polyimide, includes conductive terminals accessible at a surface thereof and flexible metallic leads connected to the terminals. The flexible dielectric sheet also preferably includes one or more bond windows extending therethrough. Each flexible lead has a first end integrally connected to one of the conductive terminal and a second end remote therefrom which projects over one of the bond windows. The flexible dielectric sheet is typically juxtaposed with a semiconductor chip so that the bond windows are aligned with contacts on a front end face of the chip and so that the second ends of the leads overlie the contacts. The flexible leads may then be bonded to the chip contacts using bonding techniques, such as ultrasonic or thermocompression bonding. After the bonding step, the resulting chip package may be electrically interconnected with an external circuit element, such as a PWB, by a similar solder-bonding process in which the solder balls are reflowed and solidified. The resolidified solder balls both mechanically and electrically interconnect the chip contacts with the contact pads on the external circuit element.

Similar procedures are used to mount connect other components with one another. The terms "land grid array" and "ball grid array" are sometimes used to describe mounting structures which use arrays of solder balls on one of the components to be connected. All of these procedures require that solder balls be placed onto contacts, terminals or other conductive features. For simplicity, the term "contact" is used in this disclosure as referring to any conductive feature which is to receive a mass of a bonding material such as a solder ball. Also, the term "microelectronic unit" is used herein as referring to any device having contacts thereon, including without limitation bare or packaged semiconductor chips, semiconductor wafers, and PWB's.

One common method of placing solder balls onto contacts of a microelectronic unit is to use a solder ball stencil having apertures arranged in a pattern corresponding to the pattern of contacts on a microelectronic unit. The apertures are just slightly larger in diameter than the solder balls. First, a pasty flux composition is applied to the contacts. Then, the solder ball stencil is disposed over the contact-bearing surface of the microelectronic unit, and the apertures of the stencil are aligned with the contacts on the microelectronic unit. Solder balls are disposed on top of the stencil and swept over the top of the stencil using a squeegee or brush, so that one solder ball falls into each aperture and onto each contact. Any excess solder balls are swept off of the stencil, whereupon the stencil is removed, leaving only one solder ball behind on each contact and held by the flux. The solder balls are then reflowed. Processes of this type encounter difficulties when placing small solder balls, such as solder balls less than about 1500 $\mu$m in diameter, and particularly when placing solder balls less than about 500 $\mu$m in diameter. Such small solder balls are required for use with compact microelectronic units having closely-spaced contacts.

As described in certain preferred embodiments of commonly assigned, copending U.S. patent application Ser. No. 09/086,808, the disclosure of which is hereby incorporated by reference herein, the solder ball stencil may have a main body portion defining the apertures and spacer elements disposed on the bottom of the main body portion. The spacer elements hold the main body portion up above the surface of the microelectronic unit, and thereby minimize contamination of the main body portion by flux. As also described in the '-808 application, excess solder balls may be retained in a reservoir used in conjunction with the solder ball stencil. Also, the top surface of the stencil may be disposed at a height above the contacts which is about equal to the diameters of the solder balls. With this arrangement, only one solder ball should be received in each aperture of the stencil, and hence only one solder ball should be deposited on each contact.

Despite the improvement in the art represented by the '-808 application, still further improvement would be desirable.

SUMMARY OF THE INVENTION

The present invention addresses these needs.

One aspect of the invention provides apparatus for applying bonding material balls such as solder balls to a microelectronic unit. Apparatus in accordance with this aspect of the invention desirably includes a stencil having an upper face, a lower face and a plurality of apertures extending through the stencil from the upper face to the lower face. The apparatus further includes an escapement element having a plurality of holes extending through it, said holes being disposed in a pattern corresponding to the pattern of the apertures in the stencil. The escapement element overlies the stencil and confronting the upper face of the stencil. Apparatus according to this aspect of the invention also includes a reservoir for holding bonding material balls above said escapement element. The apparatus further includes a movement mechanism for moving the escapement element and the stencil relative to one another between an aligned position wherein the holes in the escapement element and the apertures in the stencil are aligned and a non-aligned position wherein the holes of the escapement are out of alignment with the apertures in the stencil. Preferably, the movement mechanism is arranged to keep the stencil in a fixed position relative to a microelectronic unit aligned with the stencil, and to move the escapement element. Bonding material balls in the reservoir can pass into the apertures and onto a microelectronic unit disposed beneath the stencil when the escapement element and the stencil are in the aligned position. However, when these elements are not aligned, additional bonding material balls cannot pass through.

Preferably, the escapement element forms a bottom wall of the reservoir, and the reservoir has side walls attached to the escapement element and extending upwardly therefrom. The movement mechanism is arranged to move the reservoir and the stencil relative to one another.

The apparatus most desirably includes positioning means such as standoffs disposed at the bottom face of said stencil to engage the microelectronic unit when the stencil overlies the microelectronic unit. The positioning means is arranged to maintain the top face of the stencil at a distance above the microlectronic element less than twice the diameter of the bonding material balls being dispensed. Therefore, if two or more balls pass into any aligned hole and aperture while the escapement element and stencil are in the aligned position, the bottom-most ball in such aligned hole and aperture will engage the microelectronic unit whereas the next ball in such aligned hole and aperture will project above the top face of the stencil and will be engaged by the escapement element when the escapement element and stencil are moved to the non-aligned position. Preferably, the stencil has entry surfaces sloping upwardly toward the top face of the stencil adjacent the junctures of the holes with the top face. Thus, any bonding material balls projecting above the top face of the stencil will move up the entry surfaces when the escapement element and stencil move toward the non-aligned position. The preferred apparatus according to this aspect of the invention can reliably deposit a single small solder ball on each contact of a microelectronic unit.

A further aspect of the invention provides methods of depositing bonding material balls such as solder balls onto contacts of microelectronic units. Methods according to this aspect of the invention desirably include positioning a stencil so that a bottom face of the stencil faces towards the contact-bearing face of a microelectronic unit and a top face of the stencil faces away from the microelectronic unit, and providing bonding material balls above an escapement element overlying the top face of the stencil. The method preferably further includes moving the escapement element and stencil relative to one another to an aligned condition in which apertures in the stencil are aligned with the contacts of the microelectronic unit reservoir and holes in the escapement element are aligned with the apertures in the stencil so that bonding material balls drop through the aligned apertures and holes onto the contacts. After the solder balls have been deposited onto the contacts, the escapement element and stencil are moved relative to one another to a non-aligned position in which the holes are not aligned with the apertures so as to leave only one bonding material ball on each contact.

The method desirably further includes removing the microelectronic unit while the escapement element and bottom element are in the non-aligned position and repeating the aforesaid operations so that that method is performed cyclically, with a new microelectronic unit in each cycle. Desirably, the stencil remains in fixed position relative to the microelectronic unit during each cycle, and the escapement element moves relative to the stencil and microelectronic unit.

Most preferably, when a microelectronic unit is in position beneath the stencil, the top face of the stencil lies at a height above the contacts of the microelectronic unit less than twice the diameter of the bonding material balls. As explained above in connection with the apparatus, if two or more balls pass into any aligned hole and aperture while the escapement element and stencil are in the aligned position, the bottom-most ball in such aligned hole and aperture will engage the microelectronic unit whereas the next ball in such aligned hole and aperture will project above the top face of the stencil and will be engaged by the escapement element when the escapement element and stencil are moved to the non-aligned position.

These and other objects, features and advantages of the present invention will be more readily apparent from the detailed description of the preferred embodiment set forth below, taken in conjunction with the accompanying drawings.

DETAILED DESCRIPTION OF THE PREFERRED EMBODIMENTS

Figure 3:
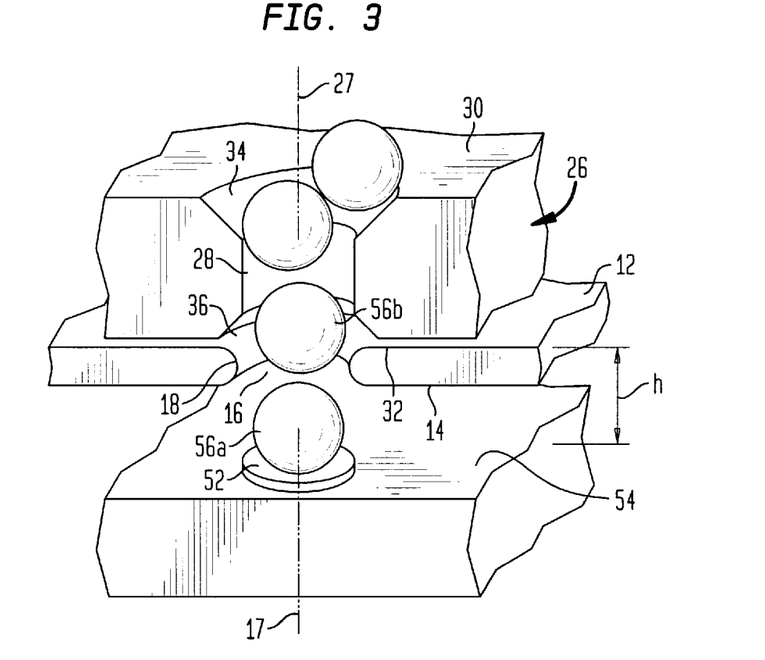
FIG. 3 is a fragmentary, diagrammatic perspective view depicting a small portion of the apparatus shown in FIGS. 1 and 2 on an enlarged scale.
Figure 4:
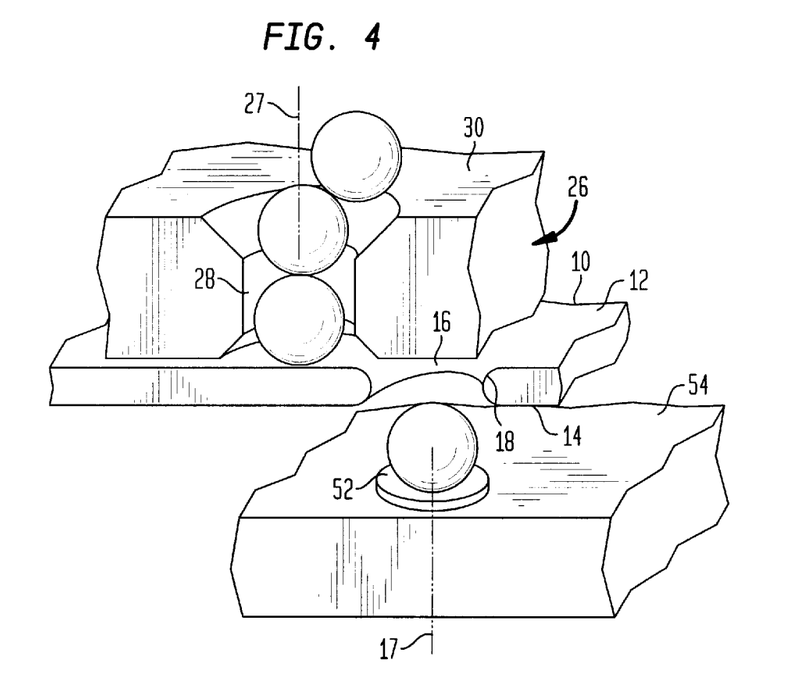
FIG. 4 is a view similar to FIG. 3 but depicting the apparatus in a different position during operation.

Apparatus in accordance with one embodiment of the invention includes a bottom element or stencil 10 having a top surface 12, a bottom surface 14 and apertures 16 extending through the stencil from the top surface to the bottom surface. Each aperture has a central axis 17. As best seen in FIGS. 3 and 4, each aperture 16 has rounded surfaces, so that an upper rounded entry surface 18 slopes upwardly and outwardly from the interior of the aperture to the top surface 12 of the stencil. Preferably, the apertures 16, at their narrowest points have diameters just slightly larger than the diameters of the solder balls to be processed. That is, the minimum diameter of each aperture should be larger than the maximum diameter of the solder balls to be processed, taking into account all tolerances on the holes and the solder balls. Larger apertures, up to just less than twice the diameter of the solder balls can be employed.

Figure 5:
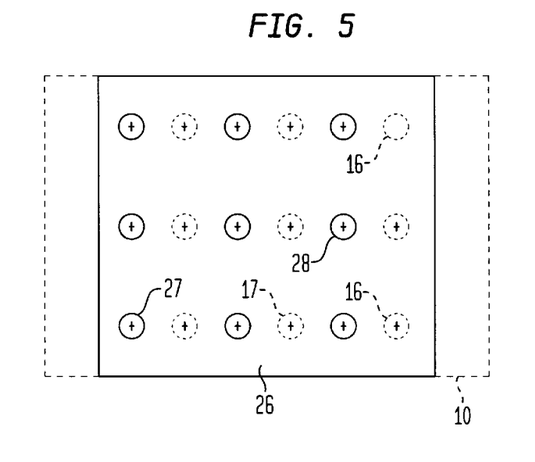
FIG. 5 is diagrammatic top plan view of elements utilized in the apparatus of FIGS. 1–4.

As best seen in FIG. 5, the apertures 16 are disposed in a rectangular grid. Although the grid illustrated is a three by three grid with nine apertures in all, it should be appreciated that the grid may include as many or as few apertures as are required to provide one aperture for each contact on the microelectronic unit to be processed. For example, a typical large semiconductor chip may have hundreds of contacts, and a stencil for use with a single chip of this type would have hundreds of apertures. Also, the apertures need not be in a regular grid; the layout of the apertures is selected to match the layout of contacts on the microelectronic element.

The apparatus also includes standoffs 20 disposed on the bottom surface 14 of stencil 10 and projecting downwardly from the bottom surface. The thickness of stencil 10, not considering standoffs 20, is less than the diameter of this solder balls to be applied, and most preferably less than about half the diameter of the solder balls. For example, where a 300 micron diameter solder ball is to be applied, the thickness of stencil 10 desirably is less than 150 microns. The thickness of standoffs 20 is selected so that the aggregate thickness of the stencil and standoffs is slightly greater than the nominal diameter of the solder balls, and at least equal to the largest diameter of any solder ball to be processed, considering all tolerances on the solder balls. However, this aggregate thickness desirably is less than 2.0 times the nominal diameter of the solder balls to be processed, and more preferably about 1.5 times such nominal diameter or less.

Figure 1:
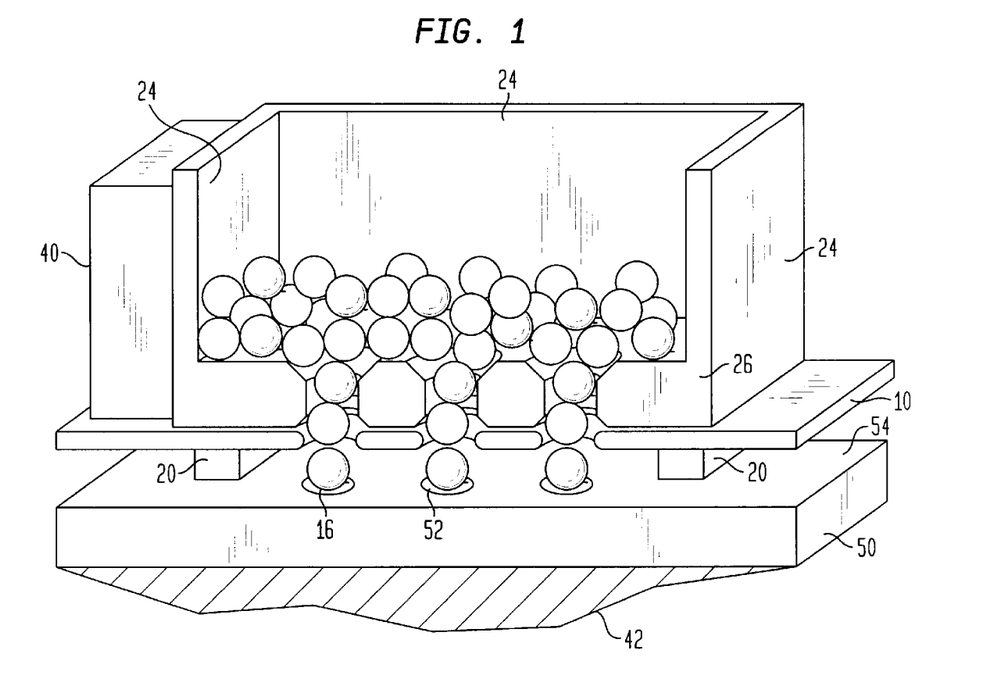
FIG. 1 is a diagrammatic, partially cutaway perspective view depicting apparatus in accordance with one embodiment of the invention.
Figure 2:
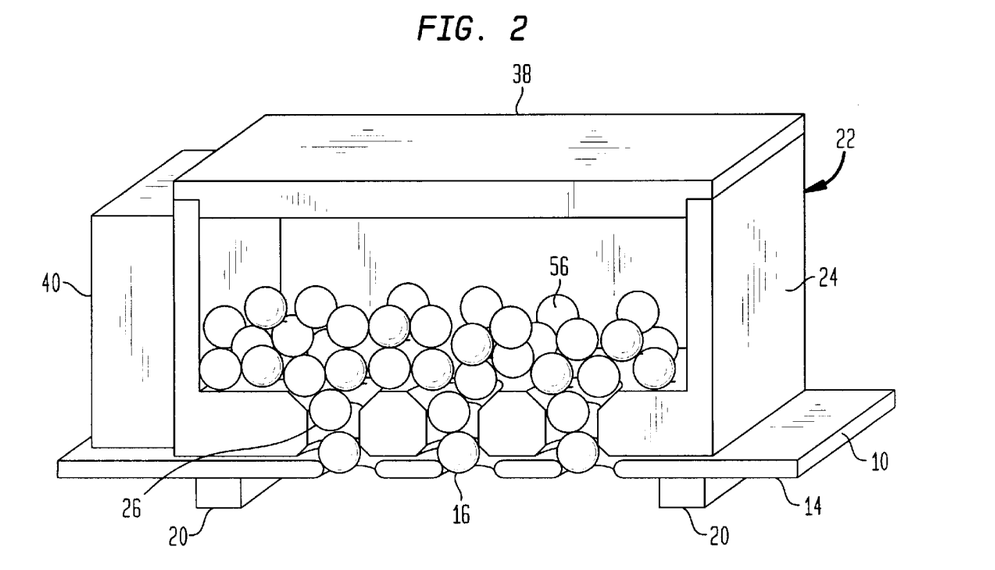
FIG. 2 is a view similar to FIG. 1 showing the apparatus in a different position during operation.

The apparatus further includes a reservoir 22 having side walls 24 extending generally vertically and having a horizontally extending bottom wall, also referred to herein as an escapement element 26. In FIGS. 1 and 2, one of the side walls has been removed for clarity of illustration. It should be appreciated that the side walls 24 extend upwardly from the bottom of escapement element 26 on all sides of reservoir 22. Escapement element 26 has a top surface 30, a bottom surface 32 and a plurality of holes 28 extending through it, between top surface 30 and bottom surface 32. Each hole has a central axis 27. Holes 28 are arranged in a grid pattern corresponding to the pattern of apertures 16. Stated another way, the pattern of hole central axes 27 is congruent with the pattern of aperture central axes 17. Each hole 28 has a chamfer 34 at the juncture of the hole with the top surface 30 of the escapement element. The holes may also have slight chamfers 36 at the juncture of the holes with the bottom surface 32. Chamfers 36 are exaggerated for quality of illustration in FIGS. 3 and 4. In practice, these chamfers desirably are smaller than the chamfers 34 at the tops of holes 28. Holes 28 are also larger in diameter than the solder balls to be dispensed. Holes 28 may be slightly larger than apertures 16, slightly smaller than the apertures or, most preferably, approximately the same diameter as the apertures.

The reservoir 22 is provided with a removable lid 38 engageable with the top edges of the side walls. Reservoir 22, and hence escapement element 26 and linked to stencil 10 by a movement device 40 arranged to reciprocate the escapement element 26 and reservoir 22 between the aligned position illustrated in FIGS. 1 and 3 and the non-aligned position depicted in FIG. 4. A position intermediate between the aligned and non-aligned positions is shown in FIG. 2. In the aligned position, holes 28 are aligned with aperture 16, i.e., the central axis 27 of the holes are coaxial or nearly coaxial with the central axis 17 of the apertures. In the aligned condition, each hole and the aperture aligned therewith cooperatively define a passageway extending from the top surface 30 of the escapement element to the bottom surface 14 of the stencil, which passageway has a diameter greater than the diameters of the solder balls to be dispensed. In the non-aligned condition as illustrated in FIG. 4, the holes and apertures are out of alignment, so that the central axis 27 of each hole in escapement element 26 is displaced from the central axis 17 of the corresponding aperture 16. In this regard, it is not essential that the holes be completely misaligned with the aperture. That is, there may be some residual overlap of the holes and apertures. However, the holes and apertures are misaligned to such a degree that they cannot cooperatively pass a solder ball. Stated another way, any area of overlap between the holes and apertures has a minimum dimension substantially smaller than the dimension of a solder ball.

Movement device 40 may be any conventional actuator as, for example, a cam mechanism, crank mechanism, piezoelectric actuator, solenoid actuator or any other device capable of moving the escapement element relative to the stencil. The movement device desirably is also capable of vibrating the reservoir so as to agitate solder balls contained in the reservoir. The elements of the movement device which provide such agitation may be the same components as are used to reciprocate the reservoir and escapement element, or else may be different components. Any conventional vibration-generating unit can be employed.

The apparatus further includes a microelectronic unit support 42 schematically illustrated in FIG. 1. Desirably, actuator 40 or stencil 10 is linked to support 42 so that stencil 10 remains in a fixed position whereas the escapement element 26 and reservoir 22 move relative to support 42 when actuator 40 reciprocates the escapement element and reservoir relative to the stencil 10.

In a method according to one embodiment of the invention, a microelectronic unit such as a semiconductor chip or packaged semiconductor chip 50 having contacts 52 on a front surface 54 is disposed on support 42. Desirably, contacts 52 are covered with a thin layer of a pasted-like flux. The flux may be applied by a thin flux stencil (not shown) so as to leave a spot of flux, desirably about 25 microns thick or less, on the top surface of each contact 52. The flux stencil may be as disclosed in the copending, commonly assigned patent application entitled Stenciling Method and Apparatus for Use Therein of Thomas Pickett, filed on or about Mar. 5, 1999, claiming benefit of commonly assigned U.S. provisional patent application No. 60/077,112 filed Mar. 6, 1998. The disclosures of both such applications are incorporated herein by reference. As described in these applications, the stencil used to apply the flux has features which minimize adhesion of the flux to the flux stencil.

While the chip, with the flux on contacts 52, is in place on support 42, reservoir 22, stencil 10 and standoffs 20 are engaged on the chip, so that standoffs 20 bear on the front surface 54 of the chip in regions remote from the contacts 52 and support the stencil 10 above the front surface of the chip. The apertures 16 in the stencil are aligned with the contacts 52. Such alignment may be achieved, for example, by conventional robotic vision apparatus or by manual alignment, desirably using a magnifying apparatus to enable the operator to gage the proper alignment visually. The stencil and the chip may be provided with fiducial marks in registration with the contacts and apertures, and these fiducial marks may be registered with one another so as to bring the stencil into the proper alignment with the chip. Alternatively, devices which physically engage features of the chip, such as the edges of the chip, may be used.

While the apparatus is being engaged with the chip, the actuator 40 maintains the reservoir 22 and hence escapement element or bottom wall 26 in the non-aligned position illustrated in FIG. 4. While the actuator maintains the elements in the non-aligned position, a large number of solder balls 56 are placed within reservoir 22. Once the stencil is in the desired position over the chip, actuator 40 is operated to bring the escapement element 26 to the aligned position illustrated in FIG. 3. In this position, a column of solder balls feeds through each hole 28 in the escapement element and the aligned aperture 16 of the stencil, so that the lower most ball 56a of each column lands on the contact 52 aligned with aperture 16. Such lower most ball is retained in position by the pasty flux on the contact. Because of the thickness of standoffs 20 and stencil 10, the top surface 12 of the stencil is disposed at a height H above the chip front surface and contacts which is just slightly larger than the diameter of a solder ball. Therefore, the second-lowest solder ball 56b in the column projects above the top surface 12 of the stencil.

In the next stage of the process, the escapement element 26 is moved to the non-aligned position illustrated in FIG. 4. As the escapement element moves, the second-lowest ball 56b in the column engages the upwardly sloping entry surface 18 of the stencil and rides up the surface onto the top surface 12 of the stencil. This brings the solder balls to the condition depicted in FIG. 4. During this operation, the lowermost solder ball 56a in each column will remain in place on the contact 52. At this point, in the process, the stencil 10 and reservoir 22 are lifted away from the chip and the chip is removed from the support 42. The solder balls are retained in place by the flux. The chip may be transferred to a reflow operation in which the solder balls are heated to above their melting temperature and then resolidified, thereby forming solder masses securely bonded onto terminals 52. Excess flux is then washed from the assembly.

After each chip has been disengaged from stencil 10, a new chip is replaced in position on support 42, the stencil is aligned with the contacts of the chip and the same cycle of operations is repeated once again. In each cycle, one and only one solder ball is applied to each contact.

Figure 6:
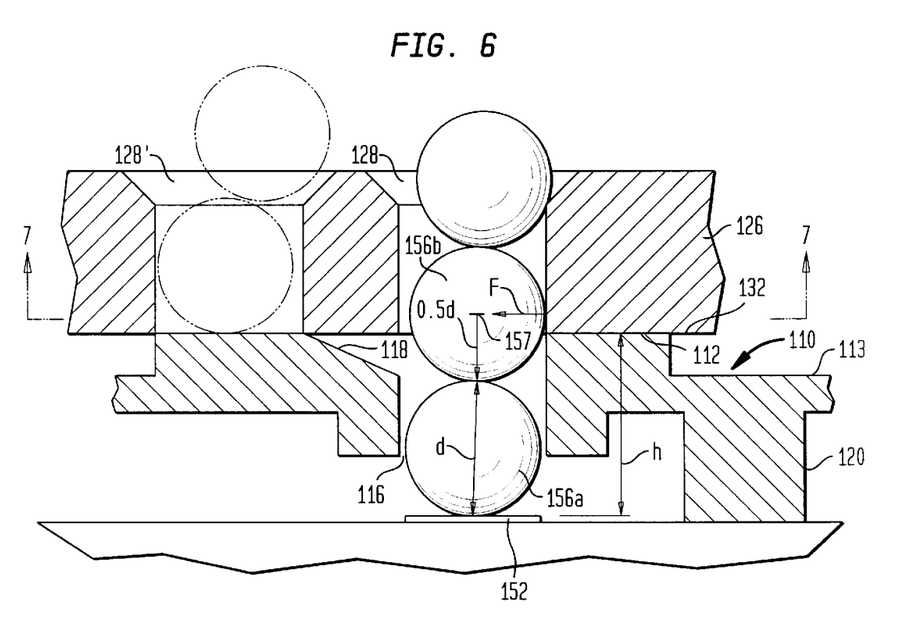
FIG. 6 is a fragmentary, diagrammatic sectional view depicting a portion of apparatus in accordance with a further embodiment of the invention.
Figure 7:
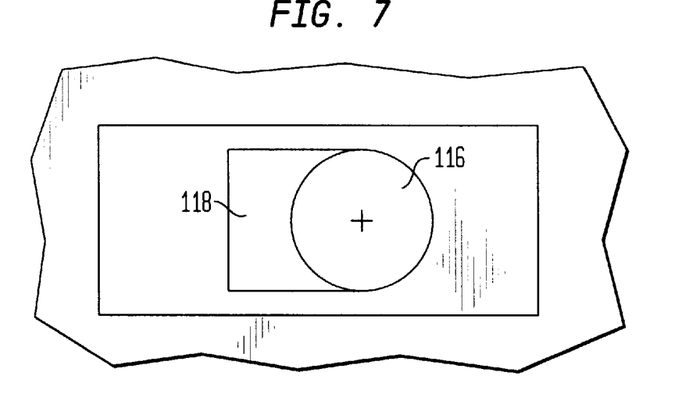
FIG. 7 is a fragmentary, diagrammatic view taken along line 7—7 in FIG. 6.

In the apparatus discussed above with reference to FIGS. 1–5, stencil 12 has a smooth upper surface, escapement element 26 has a smooth bottom surface, and these surfaces bear against one another. However, this is not essential. For example, as shown in FIG. 6, the stencil 110 may have an upper surface with lands 112 surrounding apertures 116 elevated above other portions 113 of the upper surface. Also, the standoffs 120 may be formed integrally with the stencil 110. Moreover, in the embodiment of FIGS. 6–7, each aperture 116 has an entry or lead-in surface in the form of a sloping ramp 118. The entry surfaces in this arrangement extend only on one side of the aperture 116. The sloping ramp surface extends from each aperture 116 in a direction corresponding to the direction of motion of the escapement element, holes 128 and the solder balls contained in such holes in moving from the aligned position depicted in solid lines in FIG. 6 to the non-aligned position shown in broken lines at 128' in FIG. 6. Stated another way, the benefits associated with entry surfaces in helping to lift the second solder ball 156b as the escapement element 126 moves to the non-aligned position can be achieved with an entry surface extending only in one direction from the aperture 116. Such unidirectional entry surfaces may be used, for example, where the apertures and holes must be closely spaced, leaving little room for the entry surfaces. In a further alternative, a sloping surface similar to ramp surface 118 is provided around the entire periphery of the aperture, so that the sloping entry surface forms a conical chamfer at the juncture of the aperture and the top surface of the stencil. As mentioned above, the escapement element will engage the second solder ball in a column of solder balls provided that such second solder ball protrudes above the top surface of the stencil to any degree. However, to assure a smooth rolling action, it is preferred to position the center 157 of the second solder ball 156b in a column of solder balls above the top surface 112 of the stencil and above the bottom surface 132 of the escapement element. Stated another way, the height h of the escapement element bottom surface 132 from the surfaces of contact 152 should be less than 1.5 d, where d is the nominal diameter of the solder balls, but should be greater than 1.0 d so that the bottom solder ball 156A in the column is not engaged by the escapement element. While the bottom surface of the escapement element may be positioned at a higher elevation, up to 2.0 d above the contact surface, and still engage the second solder ball, such an arrangement is less preferred because it implies that the escapement element will engage the second solder ball above its center 157. Although the escapement element is illustrated as bearing directly on the top surface 112 of the stencil, and although this arrangement is preferred, the escapement element may be slightly spaced above the top surface of the stencil provided that it is still positioned to engage the solder balls.

Figure 8:
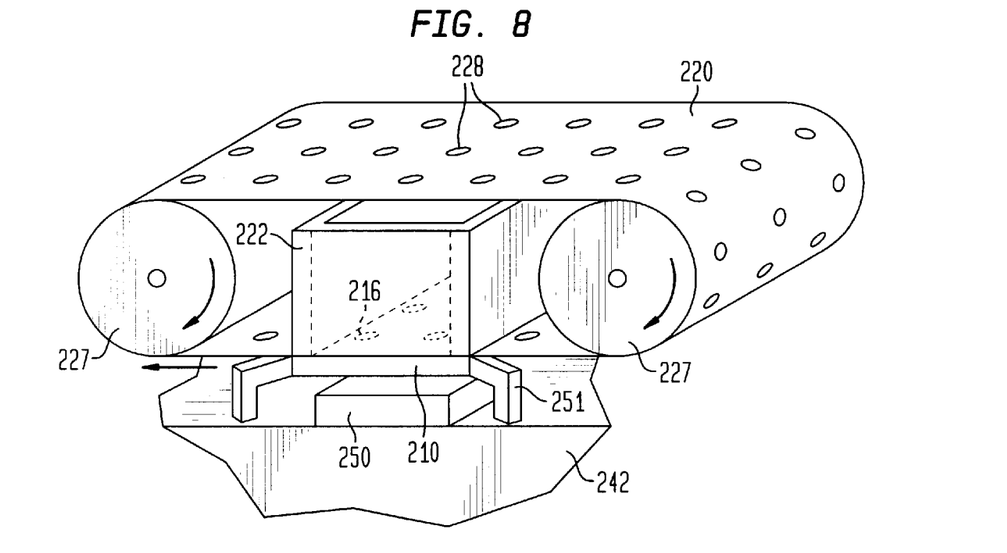
FIG. 8 is a diagrammatic, perspective view depicting apparatus in accordance with yet another embodiment of the invention.

Numerous variations and combinations of the features discussed above can be utilized without departing from the invention as defined by the claims. For example, as shown in FIG. 8, the escapement element 226 need not be formed integrally with the reservoir 222. Thus, in the embodiment of FIG. 8, reservoir 222 is formed as an open-bottomed rectangular reservoir. Escapement element 226 is provided as a thin, metallic belt such as a stainless steel belt having holes 228 therein disposed in a regular pattern corresponding to the pattern of holes 216 in stencil 210. The belt has a lower run which extends between the bottom of reservoir 222 and the top surface of stencil 210. In this arrangement, the escapement element does not reciprocate but rather advances intermittently. Thus, drums 227 are driven intermittently to advance escapement element or belt 226 to an aligned position in which the holes 228 of the escapement element are aligned with the apertures 216 of the stencil. After alignment, the belt is advanced again in the same direction to a non-aligned position. A further advance brings a new section of the belt into an aligned position. In a variant of the reciprocating escapement shown in FIGS. 1–5, the escapement element may be formed separately from the side walls of the reservoir and may be reciprocated in the same manner as discussed above with reference to FIGS. 1–5, so that the escapement element moves relative to the reservoir side walls and relative to the stencil. Also, as seen in FIG. 8, stencil 210 is supported above the microelectronic unit 250 by brackets 251 engaged with the microelectronic unit support 242 rather than by standoffs engaging the front surface of the microelectronic unit. Thus, means other than standoffs may be used to maintain the stencil and escapement element at the desired height above the contact-bearing surface of the microelectronic unit.

Figure 9:
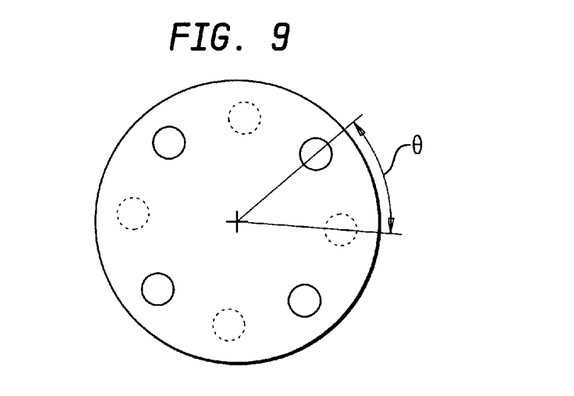
FIG. 9 is a diagrammatic plan view depicting elements of apparatus in accordance with another embodiment of the invention.

In other arrangements, the escapement element may rotate about a vertical axis 333 (FIG. 9) between its aligned and non-aligned positions. Thus, escapement element 326 swings through an angle θ between its aligned position, depicted in solid lines and its non-aligned position depicted in broken lines. In this variant as well, the escapement element may be formed integrally with the side walls of the reservoir or separately from the side walls.

The discussion above has focused on processing of semiconductor chips. However, other microelectronic units such as packaged semiconductor chips can be processed in accordance with the invention. Some microelectronic units have contacts which, although exposed at a surface of the unit, are slightly recessed from the remainder of such surface. Other units have contacts protruding upwardly from the remainder of the surface. Where the stencil is positioned with reference to the front surface, appropriate adjustments should be made to maintain the desired spacing of the stencil top surface and escapement element bottom surface above the contacts. For example, where the contacts are recessed into the front surface, the standoffs should be thinner. Further, larger units such as a set of plural chips, an entire wafer or a portion of a wafer can be processed. In this case, the stencil and escapement element are enlarged to provide the requisite number of holes and apertures.

In still further variations, balls of bonding material other than simple solder balls can be handled in precisely the same manner as described above. For example, so-called "solid core" solder balls may be used. Also, balls containing bonding materials other than solder, such as diffusion-bonding alloys can be employed.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. Apparatus for applying bonding material balls to a microelectronic unit comprising:
   (a) a stencil having an upper face, a lower face and a plurality of apertures disposed in a pattern extending through the stencil from the upper face to the lower face;
   (b) an escapement element having a plurality of holes extending through it, said plurality of holes being disposed in a pattern corresponding to the pattern of said plurality of apertures extending through the stencil, said escapement element confronting the upper face of said stencil;
   (c) a reservoir for holding bonding material balls above said escapement element; and
   (d) a movement mechanism for moving said escapement element between an aligned position wherein said plurality of holes are aligned with said plurality of apertures and a non-aligned position wherein said plurality of holes are out of alignment with said plurality of apertures, wherein said escapement element is a bottom wall of said reservoir, said reservoir having side walls attached to said escapement element and extending upwardly therefrom, said movement mechanism being operative to move the reservoir and the stencil relative to one another, whereby bonding material balls in said reservoir can pass into said plurality of apertures and onto a microelectronic unit when said stencil overlies the microelectronic unit and said escapement element is moved to said aligned position.

2. Apparatus as claimed in 1 further comprising positioning means for maintaining the upper face of the stencil at a distance above the microelectronic unit less than twice the diameter of the bonding material balls being dispensed, whereby if two or more balls pass into any aligned hole and aperture while the escapement element and stencil are in the aligned position, the bottom-most ball in such aligned hole and aperture will engage the microelectronic unit whereas the next ball in such aligned hole and aperture will project above the upper face of the stencil and will be engaged by the escapement element when the reservoir and stencil are moved to the non-aligned position.

3. Apparatus as claimed in 2 wherein said apertures in said stencil have entry surfaces sloping upwardly toward the upper face of said stencil, whereby bonding material balls projecting above the upper face of the stencil will move up the entry surfaces when the escapement element and stencil move toward the non-aligned position.

4. Apparatus as claimed in claim 1 wherein said movement mechanism is arranged to move said escapement element while leaving said stencil in a fixed position relative to the microelectronic unit.

5. Apparatus as claimed in 1 further comprising agitation means for agitating bonding material balls disposed in said reservoir.

6. Apparatus for applying bonding material balls to a microelectronic unit comprising:
   (a) a stencil having an upper face, a lower face and a plurality of apertures disposed in a pattern extending through the stencil from the upper face to the lower face;
   (b) an escapement element having a plurality of holes extending through it, said plurality of holes being disposed in a pattern corresponding to the pattern of said plurality of apertures extending through the stencil, said escapement element confronting the upper face of said stencil;
   (c) a reservoir for holding bonding material balls above said escapement element;
   (d) a movement mechanism for moving said escapement element between an aligned position wherein said plurality of holes are aligned with said plurality of apertures and a non-aligned position wherein said plurality of holes are out of alignment with said plurality of apertures, whereby bonding material balls in said reservoir can pass into said plurality of apertures and onto a microelectronic unit when said stencil overlies the microelectronic unit and said escapement element is moved to said aligned position; and
   (e) positioning means for maintaining the upper face of the stencil at a distance above the microelectronic element less than twice the diameter of the bonding material balls being dispensed, wherein said positioning means includes standoffs disposed at said bottom face of said stencil so that said standoffs engage the microelectronic unit when the stencil overlies the microelectronic unit.

7. Apparatus as claimed in claim 6 wherein said standoffs are connected to said stencil.

8. A method of depositing bonding material balls onto contacts of microelectronic units comprising the steps of:
(a) positioning a stencil so that a bottom face of the stencil faces towards the contact-bearing face of a microelectronic unit, and an upper face of the stencil faces away from the microelectronic unit;
(b) providing bonding material balls above an escapement element overlying the upper face of the stencil; and
(c) moving the escapement element and stencil relative to one another between an aligned condition in which apertures in the stencil are aligned with the contacts of the microelectronic unit and holes in the escapement element are aligned with the apertures in the stencil and bonding material balls drop through the aligned apertures and holes onto the contacts, and then moving the escapement element and stencil relative to one another to a non-aligned position in which the holes are not aligned with the apertures so as to leave only one bonding material ball on each contact, wherein the escapement element forms a bottom wall of a reservoir containing said bonding material balls, and wherein the reservoir moves along with the escapement element, whereby movement of the reservoir helps to agitate the bonding material balls within the reservoir.

9. A method as claimed in claim 8 further comprising the steps of removing the microelectronic unit while the escapement element and bottom element are in the non-aligned position and repeating the aforesaid operations so that that method is performed cyclically, with a new microelectronic unit in each cycle.

10. A method as claimed in claim 9 wherein, when a microelectronic unit is in position beneath the stencil, the top face of the stencil lies at a height above the contacts of the microelectronic unit less than twice the diameter of the bonding material balls, whereby if two or more balls pass into any aligned hole and aperture while the escapement element and stencil are in the aligned position, the bottom-most ball in such aligned hole and aperture will engage the microelectronic unit whereas the next ball in such aligned hole and aperture will project above the top face of the stencil and will be engaged by the escapement element when the reservoir and stencil are moved to the non-aligned position.

11. A method as claimed in claim 10 wherein said stencil has upwardly-sloping entry surfaces at the junctures of said apertures and the top face of the stencil, and wherein the escapement element engages said projecting balls and moves them along the entry surfaces as the escapement element and stencil move toward the non-aligned position.

12. A method as claimed in claim 9 wherein said stencil remains in fixed position relative to the microelectronic unit during each cycle, and the escapement element moves relative to the stencil and microelectronic unit.

13. A method as claimed in claim 9 further comprising activating the bonding material in the balls deposited on each microelectronic unit after removing that microelectronic unit from the stencil and escapement element.

14. A method of depositing bonding material balls onto contacts of microelectronic units comprising the steps of:
(a) positioning a stencil so that a bottom face of the stencil faces towards the contact-bearing face of a microelectronic unit, and an upper face of the stencil faces away from the microelectronic unit;
(b) providing bonding material balls above an escapement element overlying the upper face of the stencil; and
(c) moving the escapement element and stencil relative to one another between an aligned condition in which apertures in the stencil are aligned with the contacts of the microelectronic unit and holes in the escapement element are aligned with the apertures in the stencil and bonding material balls drop through the aligned apertures and holes onto the contacts, and then moving the escapement element and stencil relative to one another to a non-aligned position in which the holes are not aligned with the apertures so as to leave only one bonding material ball on each contact, further comprising providing a flux on each said microelectronic unit, said flux physically binding the balls to the contacts of each said microelectronic unit prior to activating the bonding material.

\* \* \* \* \*

UNITED STATES PATENT AND TRADEMARK OFFICE
CERTIFICATE OF CORRECTION

PATENT NO.     : 6,253,992 B1  Page 1 of 1
DATED          : July 3, 2001
INVENTOR(S)    : Fjelstad It is certified that error appears in the above-identified patent and that said Letters Patent is hereby corrected as shown below:

Column 1,
Line 8, after "expired" insert -- , --.
Line 66, "terminal" should read -- terminals --.

Column 3,
Line 14, "confronting" should read -- confronts --.

Column 5,
Line 34, "this" should read -- the --.

Column 6,
Line 8, "and" (second occurrence) should read -- are --.

Column 10,
Lines 11, 23 and 33, after "in" insert -- claim --.

Signed and Sealed this

Twenty-sixth Day of February, 2002

Attest:

JAMES E. ROGAN
*Attesting Officer*  *Director of the United States Patent and Trademark Office*